United States Patent
Tsukanov et al.

(10) Patent No.: US 7,063,975 B2
(45) Date of Patent: Jun. 20, 2006

(54) SHALLOW TRENCH POWER MOSFET AND IGBT

(75) Inventors: Vladimir Tsukanov, Sunnyvale, CA (US); Nathan Zommer, Los Altos, CA (US)

(73) Assignee: IXYS Corporation, Santa Clara, CA (US)

( * ) Notice: Subject to any disclaimer, the term of this patent is extended or adjusted under 35 U.S.C. 154(b) by 0 days.

(21) Appl. No.: 10/678,479

(22) Filed: Oct. 3, 2003

(65) Prior Publication Data

US 2004/0124489 A1    Jul. 1, 2004

Related U.S. Application Data

(60) Provisional application No. 60/422,036, filed on Oct. 28, 2002.

(51) Int. Cl.
*H01L 21/336*    (2006.01)

(52) U.S. Cl. .................................. 435/270; 257/341
(58) Field of Classification Search .......... 438/212, 438/259, 268, 589, 270–272; 257/329–332, 257/341
See application file for complete search history.

(56) References Cited

U.S. PATENT DOCUMENTS

| | | |
|---|---|---|
| 4,959,699 A | 9/1990 | Lidow et al. |
| 5,008,725 A | 4/1991 | Lidow et al. |
| 5,187,117 A | 2/1993 | Zommer |
| 5,629,543 A * | 5/1997 | Hshieh et al. ............... 257/330 |
| 5,629,552 A | 5/1997 | Zommer |
| 5,689,128 A * | 11/1997 | Hshieh et al. ............... 257/331 |
| 6,133,587 A * | 10/2000 | Takeuchi et al. ............... 257/77 |

* cited by examiner

*Primary Examiner*—David Vu
(74) *Attorney, Agent, or Firm*—Townsend and Townsend and Crew LLP (57) ABSTRACT

A power semiconductor device includes a substrate having an upper surface and a lower surface. The substrate has a trench. First and second doped regions are provided proximate the upper surface of the substrate. A first source region is provided within the first doped region. A second source region is provided within the second doped region. A gate is provided between the first and second source regions. The gate includes a first portion extending downward into the trench. A depth of the trench is no more than a depth of the first doped region.

5 Claims, 6 Drawing Sheets

SHALLOW TRENCH POWER MOSFET AND IGBT

CROSS-REFERENCES TO RELATED APPLICATIONS

The present application claims priority from U.S. Provisional Patent Application No. 60/422,036, filed on Oct. 28, 2002, which is incorporated by reference.

BACKGROUND OF THE INVENTION

The present invention relates to power devices including power metal-oxide-semiconductor field effect devices or transistors ("MOSFETs") and insulated gate bipolar transistors ("IGBTs").

The power semiconductor devices include a MOSFET that is a majority carrier device and an IGBT that functionally integrates a MOSFET and Bipolar Junction Transistor. There are four types of MOSFETs: (1) n-channel device operating in enhancement mode, (2) n-channel device operating in depletion mode, (3) p-channel device operating in enhancement mode, and (4) p-channel device operating in depletion mode. Most of commercially available Power MOSFETs are n-channel devices because higher carrier mobility of electrons provides lower on-state losses for n-channel MOSFETs. Examples of n-channel devices will be discussed below though extension to p-channel devices is possible.

Currently most common Power MOSFETs are manufactured as either a planar double diffused MOSFET ("DMOS") or a trench MOSFET. The DMOS devices and trench MOSFETs are distinguished by their respective gate structures and channel geometry. Channel is parallel to the plane of substrate for DMOS transistors. Trench MOSFET have a channel which is vertical to respect of the plane of substrate.

Figure 1:
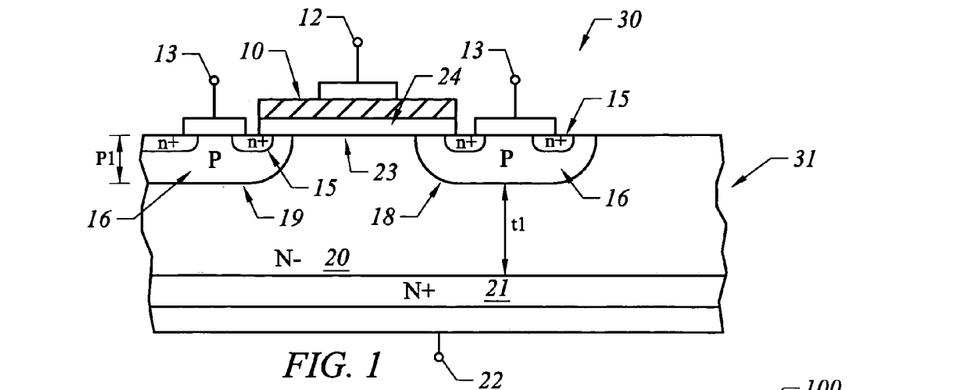
FIG. 1 shows a schematic cross-sectional view of a conventional planar DMOS device.

As shown in FIG. 1, a DMOS cell 30 has a planar gate structure that is provided on the substrate. The DMOS cell 30 includes a polysilicon gate 10 that is substantially planar and parallel to the top surface of a semiconductor substrate 31. Although the DMOS transistor generally includes a plurality of gates, only one gate is shown for illustrative simplicity.

In case of N-channel DMOS transistor the substrate is an n– type semiconductor material and includes an upper layer 20 that is n– layer and a lower layer 21 that is n+ layer. Generally the upper n– layer 20 has a lower doping concentration than the lower layer. A gate electrode 12 is connected to the polysilicon gate 10. A film of gate dielectric 24, typically-silicon oxide, provided below the gate 10 is parallel to the top surface and has a planar structure. A JFET conduction area 23 between p-wells 16 is formed below the gate 10. A plurality of source regions 15 is provided on the edges of the gate 10. The source regions are n– type regions and defined within the p-wells 16. A drain electrode 22 is formed on a bottom surface of the substrate 31. Accordingly, electrons flow vertically from the source to drain regions when positive voltage is applied to the gate electrode 12 with respect to source electrode 13.

Figure 2:
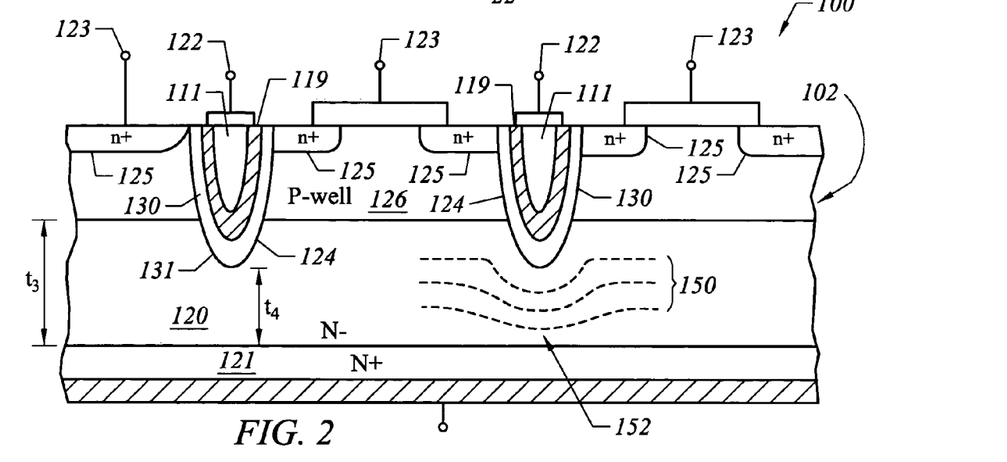
FIG. 2 shows a schematic cross-sectional view of a conventional trench power MOS transistor.

FIG. 2 illustrates a trench power MOS transistor 100 including a polysilicon gate 119 that is formed within a trench 111. Accordingly, the gate 119 is not planar in respect to the top surface of a semiconductor substrate 102. The substrate includes an n– upper layer 120 and an n+ lower layer. A p-well 126 is formed at upper portion of the n– layer 120.

The trench includes substantially vertical side walls 130 etched into the substrate. Accordingly, the gate 119 has a significant vertical portion extending into the substrate. Generally, a bottom of the trench penetrates the p-well 126 and extends into a layer underneath, i.e., the n– layer 120.

Power devices are generally characterized by breakdown voltage ("BV") ratings to indicate their normal voltage range of operations. The BV of conventional power device is influences by several factors: (1) the curvature of the p-wells 16 of the transistors (the greater the curvature, the lower the BV of the device); (2) the thickness and resistivity of the n– layer 20 (the lower thickness or resistivity the lower BV of the device); (3) depth of p-well 16 (for a given n– region thickness, the deeper the p-well, the lower the BV since the deeper p-well reduces the net n– layer thickness). As illustrated in FIG. 1, the net thickness of the n– layer 20 is defined as a distance t1 from a bottom surface of the p-well 16 to a bottom surface of the n– layer 20 in FIG. 1. In FIG. 2, the net thickness of n– layer 120 is a distance from a bottom of the gate structure to a bottom of the n– layer. The depth of the p-well 16 is defined as a distance p1 from a top surface of the substrate to a bottom surface of the p-well.

Figure 3:
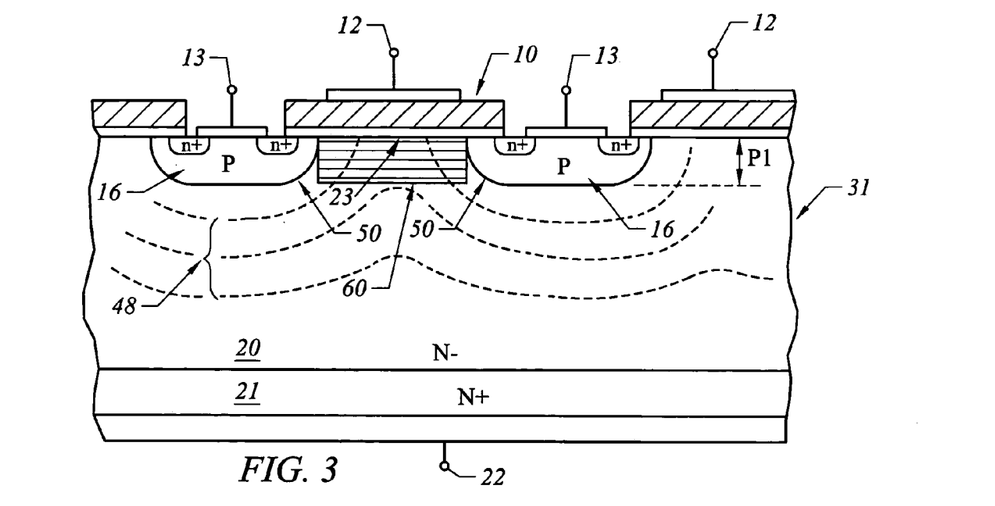
FIG. 3 shows curved equi-potential lines and a boxed region in the planar DMOS of FIG. 1.

In case of the planar DMOS transistor, the BV of the device in active area is sufficiently lower than BV of a planar p-n junction formed in the same n– layer. Relative reduction of BV is due to the curvature of the p-n junction 50 and the equi-potential lines 48, as illustrated in FIG. 3. The equi-potential lines 48 describe the potential distribution in the devices under reverse voltage bias in its off state. The shallower the p-wells the higher the curvature of p-n junction, the higher the concentration of electrical field associated with p-n junction curvature the lower the BV.

In addition, the planar DMOS transistors are affected by a "neck" problem due to the curved p-wells. That is, a narrow current path or "neck" is created under the gate area 23 in the n-region between adjacent p-wells (FIGS. 1 and 3). This neck causes formation of a constricted current flow region for the electrons when the transistor is turned on. This constricted region is also referred to as the "JFET" region because of modulation of resistance of this area by the potential of p-well (pinch-off). This region adds to the on resistance ($R_{on}$) of the power DMOS transistors. A "boxed" region 60 in FIG. 3 represents the neck region that contributes to the increase of $R_{on}$. When the planar DMOS device is turned on, the current has to go through this neck region, thereby reducing the efficiency of the device. As the voltage ratings of the device increases above a certain level (e.g., about 150V), this increase in $R_{on}$ becomes a more serious issue.

Trench gate MOS transistors are not affected by "neck" problem. P-n junction of the p-well 126 and n– layer 120 (FIG. 2) is substantially flat, so there is no electrical field concentration and reduction of the BV due to p-n junction curvature. Referring again to FIG. 2, a bottom portion 131 of the gate that penetrates through p-well 126 creates a sharp geometry in the n-region 120. Higher electric fields are formed thereon, thereby reducing the BV of the device. A method of forming trench power MOSFETs as V-groove MOS is described in "MOSPOWER Application Handbook," by Rudy Severns, 1984, Chapter 2.5; and K. Lisiak and J. Berger, "Optimization of Nonplanar Power MOS Transistors," IEEE Transaction Electron Devices Vol. ED-25, 1978 pp. 1229–1234. Furthermore, the net epi thickness is reduced to a thickness t4 under the trench gate from a thickness t3 due to extension of the bottom portion 131 into the n– layer 120, which increases the electric field at that location and reduces the BV.

The shape of the trench which creates a protrusion with a sharp curvature or edges also leads to increased electric fields, as depicted by the curvature of equi-potential lines 150 in FIG. 2. The equi-potential lines are compressed at a region 152 below the trench since the same potential lines occupy a thinner epi region, thereby resulting in increased electric fields and reduced BV.

Furthermore, when the device is in a blocking voltage state, the penetration of the trench 111 into the epi region 120 forces parts of the electric fields to be in a portion of the gate oxide 124 under the gate on the tip of the bottom portion 131 of the trench 111. This extra field in the gate oxide exposes the device to gate oxide rupture failures during high voltage operations and high power switching applications. As a result, the trench MOS technology has found limited use in high voltage power MOS applications, e.g., at about 200V and above.

BRIEF SUMMARY OF THE INVENTION

Embodiments of the present invention are directed to a power device structure and a method of manufacturing such a device. The power device of the present embodiments has higher breakdown voltage (BV) and lower forward voltage drop. In one implementation, a power MOS gated device is configured to operate at 100 Volts to 1200 Volts or more.

In one embodiment, a power MOSFET device includes a gate formed in a shallow trench between bases having a base depth on a substrate. The shallow trench is a trench which has a depth equal to or smaller than the base depth.

In one embodiment, a power semiconductor device includes a substrate having an upper surface and a lower surface. The substrate has a trench. First and second doped regions are provided proximate the upper surface of the substrate. A first source region is provided within the first doped region. A second source region is provided within the second doped region. A gate is provided between the first and second source regions. The gate includes a first portion extending downward into the trench. A depth of the trench is no more than a depth of the first doped region.

In one embodiment, a power semiconductor device includes a substrate having an upper surface and a lower surface, the substrate having a trench; a first doped region provided proximate the upper surface of the substrate; a first source region provided within the first doped region; and a gate provided adjacent the first source region, the gate including a first portion provided within the trench, wherein a depth of the trench is no more than a depth of the first doped region.

In another embodiment, a power semiconductor device includes a substrate having a first surface and a second surface, the substrate having a trench having a first depth; a doped region provided proximate the first surface of the substrate and having a second depth; a source region provided within the first doped region and proximate the first surface; and a gate provided adjacent to the source region, the gate including a first portion provided within the trench and a second portion provided outside of the trench, the first portion having a length that is greater than the first depth of the trench.

In another embodiment, a power semiconductor device includes a substrate having an upper surface and a lower surface. The substrate has a shallow trench. First and second doped regions are provided proximate the upper surface of the substrate. A first source region is provided within the first doped region. A second source region is provided within the second doped region. A split gate structure is provided between the first and second source regions. The split gate structure includes a first gate portion and a second gate portion. The first and second gate portions each includes an upper portion provide outside of the shallow trench and a lower portion provided within the shallow trench, wherein a depth of the shallow trench is no more than a depth of the first doped region.

In yet another embodiment, a method for fabricating a power semiconductor device includes forming a shallow trench on a substrate having a first surface and a second surface, the trench having a first depth; forming a gate region having a first portion provided within the trench and second portion provided outside the trench; forming a doped region provided proximate the first surface of the substrate and having a second depth; forming a source region provided within the first doped region, proximate the first surface and adjacent the gate region.

DETAILED DESCRIPTION OF THE INVENTION

A way to increase the BV is to reduce the off-state curvature of the equi-potential lines. This can be achieved simultaneously with reduction or elimination of the "neck" between the adjacent p-wells as shown in the previous devices, box 60 in FIG. 3.

Figure 4:
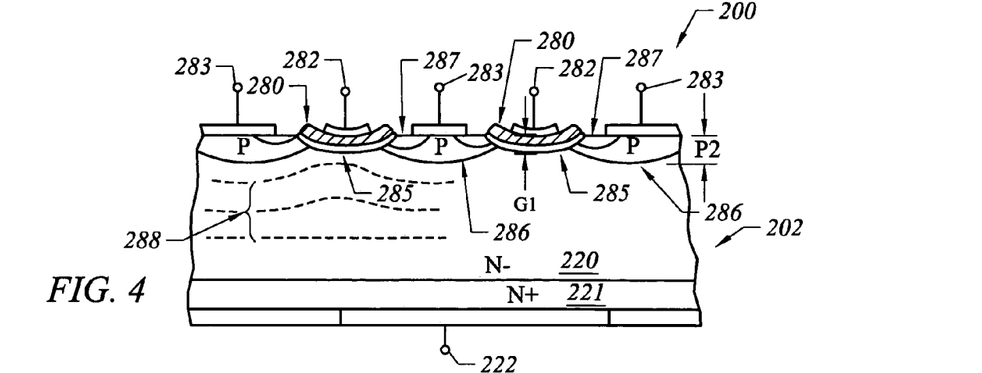
FIG. 4 shows a schematic cross-sectional view of a shallow trench power MOSFET according to one embodiment of the present invention.

FIG. 4 illustrates a power device 200 having a gate structure with a non-planar portion that extends into a substrate 202. The substrate includes an upper layer 220 of n− type and a lower layer 221 of n+ type. Gate 280 is formed partially on a planar surface of substrate and partially within a trench. Trench is shallow, it does not extend beyond the p-well, unlike the conventional trench MOSFETs.

The device 200 includes a plurality of gates 280 that are coupled to gate electrodes 282, a plurality of source regions 287 provided adjacent to the gates 280, and a drain 222. The gates and sources are provided at an upper surface of the substrate 202 and the drain is formed at a bottom surface of the substrate 202. The n− type source regions 287 are formed within p-type doped wells 286 and coupled to source electrodes 283. The doped wells 286 are p-wells in the present embodiment.

The device 200 includes a shallow trench 285 (or valley) etched into the upper layer 220 of the substrate in between two bases or p-wells 286. The shallow trench 285 nas a depth G1 that is less than a depth P2 of the base 286. In one embodiment, the depth P2 of the p-well 286 is about 0.5 μm to about 6 μm, or greater. In another embodiment, the depth P2 is provided to be about 3 μm, or 2 μm or less.

In one embodiment, for a gate technology of about 3 μm, the depth G1 of the shallow trench is 1.5 μm. Generally, the depth G1 is about 0.5 μm to about 2 μm, or about 0.5 to 0.9 of the depth P2 of the well 286. In another embodiment, the gate length is about 1 μm to about 40 μm, preferably about 2 μm to about 8 μm, or more preferably about 3–4 μm. The gate length extending between two sources (the width of the trench) is generally greater than the depth of the shallow trench G1. In one embodiment, a ratio of the gate length (trench width) to the depth G1 of the shallow trench is 1.5:1, 2:1, 2.5:1, 3:1, 3.5:1, 4:1, 4.5:1, 5:1, or greater according to the application.

Placing the gate into the shallow trench partly or entirely eliminates the JFET region problem of the conventional planar DMOS power devices and lowers the resistance $R_{on}$ of the devices.

As shown in FIG. 4, the curvature of equi-potential lines 288 is reduced by forming the gate 280 that extends into the valley 285, thereby reducing electric fields in the vicinity of the p/n junction. This electric field reduction increases the BV of the device 200 having configuration, such that G1<P2.

Figure 5:
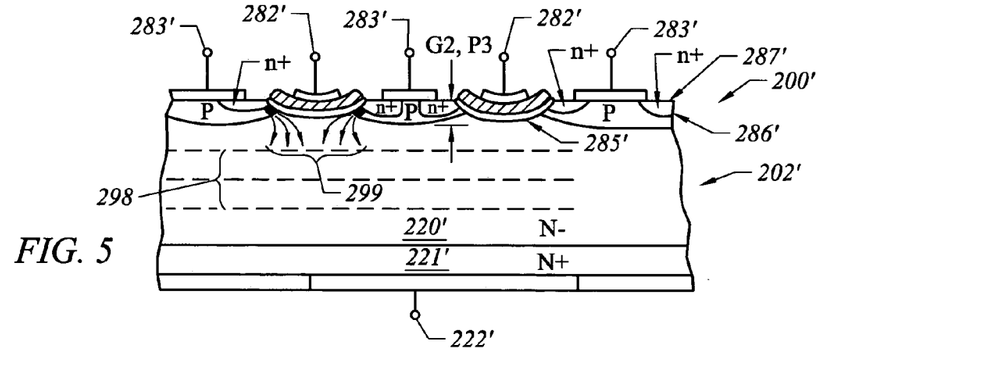
FIG. 5 shows near planar equi-potential lines in a shallow trench power MOSFET according to another embodiment of the present invention.

FIG. 5 illustrates a power device 200' having a gate structure that extends into a substrate 202' according to one embodiment of the present invention. The device is provided with a shallow trench or valley 285' having a depth G2 that is substantially equal to a depth P3 of a p-well 286'. As a result, equi-potential lines 298 are rendered planar or parallel to the flat surfaces of the substrate 202'.

If the shallow trench 285' is provided with substantially the same depth as the p-well 286', i.e., G2=P1, the device is provided with a p/n junction structure that is effectively planar. Consequently, the equi-potential lines in the transistor cell do not have a significant curvature.

The device 200' with a substantially planar equi-potential lines, i.e., without a significant curvature of equi-potential lines, have been proven to have a higher BV for given n− layer resistivity and thickness and other relevant parameters.

Influence of a shallow trench on the BV of DMOS transistors was found to be following. A shallow trench DMOS provided with the same configuration as a conventional DMOS with BV=270 volts, except for the shallow trench gate, showed an increase in breakdown voltage of 50 volts, or BV=320 volts. Similarly, a shallow trench DMOS with the same configuration as a conventional DMOS with BV=340V, except for the shallow trench gate, showed an increase in breakdown voltage of 75 volts, or BV=415V.

Accordingly, the device 200 or 200' could provide higher BV rating compared to conventional DMOS 30 without an increase of $R_{on}$ of the MOSFET. In other words, a shallow trench Power MOSFET 200 or 200' with a given BV rating has a lower $R_{on}$ when compared to a conventional DMOS power MOSFET 30 having the same BV rating.

In addition, the formation of the shallow trench or valley partially or completely removes the "n-neck" or JFET region as shown in FIG. 5. Arrows 299 indicate the effective current flow from the MOSFET channel into the n-region when the device is turned on. In the device 200', the current does not need to flow through a constricted n-neck unlike the conventional device 31, thereby lowering the resistance $R_{on}$. However, this benefit is provided without creating a sharp curvature of the equi-potential lines as in the conventional trench power devices 102.

Therefore, the present embodiment is directed to a power device configured to operate at 100 volts or greater, or 300 volts or greater, or 500 volts, or 800 volts or greater, or 1,000 volts or greater. Generally, the IGBTs are operated at higher voltage regimes than the power MOSFETs. In one implementation, a device having a shallow trench gate structure is configured for operation in a voltage range of about 300 volts to about 2,500 volts as an IGBT. In another implementation, a device having a shallow trench gate structure is configured for operation in a voltage range of about 100 volts to about 1,200 volts as a power MOSFET.

Figure 6:
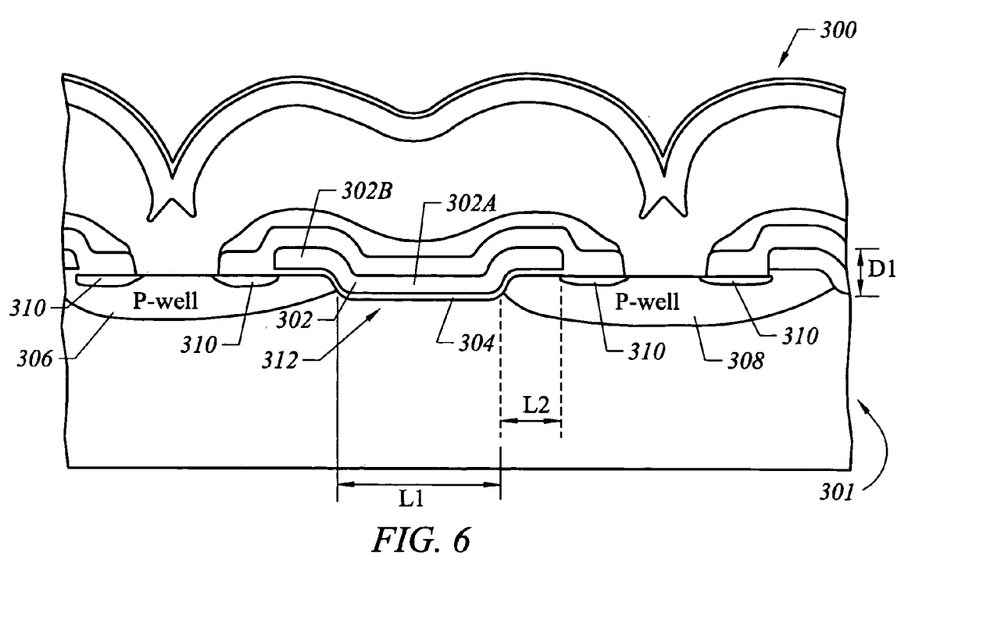
FIG. 6 shows a cross-sectional view of a shallow trench power MOSFET according to one embodiment of the present invention.

FIG. 6 show a cross-sectional view of a power device 300 having a gate 302 extending into a shallow trench 312 that has been etched into a substrate 301 according to one embodiment of the present invention. The shallow trench is provided with a depth D1 of about 1–2 μm and a length L1 of about 2–6 μm, or more. The gate 302 includes a first portion 302A that extend into the trench 312 and a second portion 302B that are provided over the substrate and extend outside of the trench 312. The second portion 302B provided at opposing sides of the trench has a total length of about 0.6–6 μm. That is, each extends about 0.3–3 μm (a distance L2) toward the adjacent source region 310. The gate 302 is polysilicon material in the present embodiment.

In one embodiment, the first portion 302A of the gate 302 has a substantially planar lower surface, thereby minimizing a sharp curvature. The first portion is longer than the second portion. The first portion is also greater than the D1. In one implementation, a ratio of L1 to D1 is 1.5:1, or 2:1, or 2.5:1, 3:1, or 3.5:1, or 4:1, 4.5:1, 5:1, or 10:1, or 20:1.

The device 300 includes a gate oxide 304 provided between the gate 302 and substrate 301. A first p-well 306 and a second p-well 308 are provided at opposing edges of the gate 302. A plurality of source regions are defined within the p-wells. A drain region (not shown) is defined on an opposing side of the substrate.

Figure 7A:
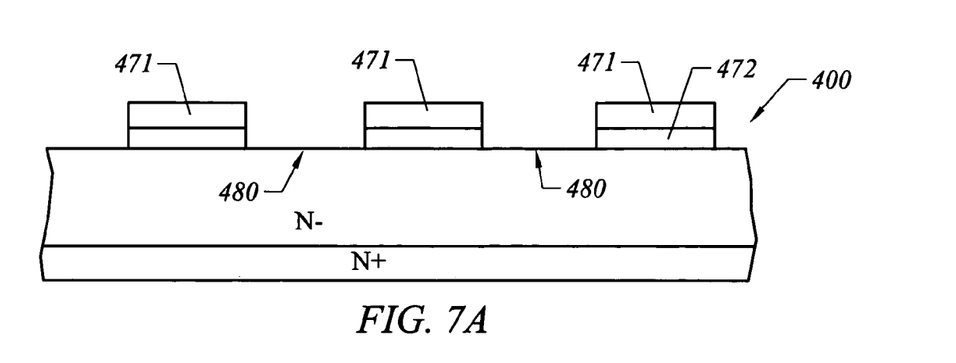
FIGS. 7A–7C illustrate a method for forming a shallow trench power MOSFET according to one embodiment of the present invention.
Figure 7B:
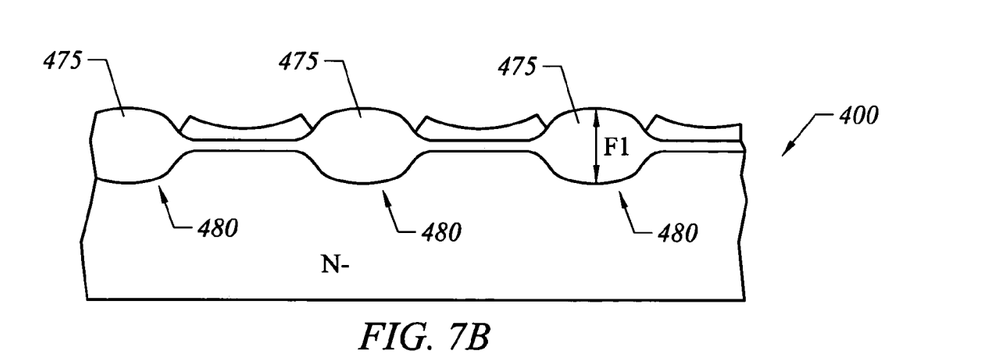
Figure 7C:
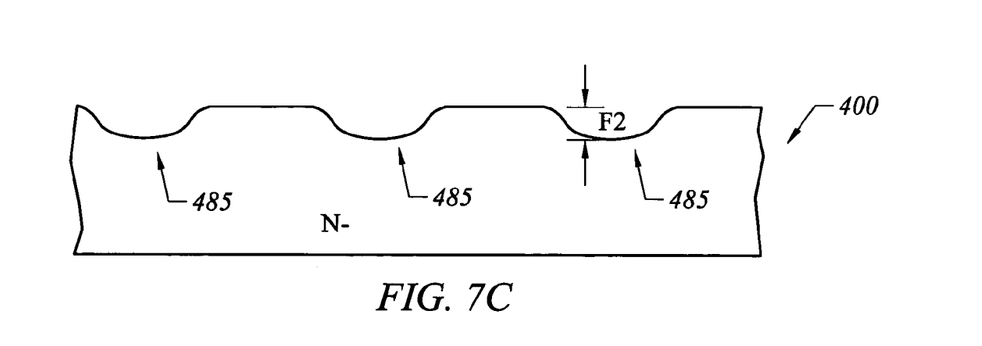

FIGS. 7 and 8 illustrate methods of forming a shallow trench on a substrate according to embodiments of the present invention. In the conventional trench-based devices, the trenches have been etched into the surface using a dry or wet etch method. The dry etch methods include plasma or reactive ion etching (RIE). However, these conventional etch techniques provide coarse of trench depth control by controlling the etch time. Alternatively, certain wet etch methods self-stopping process primarily using an etch mask opening size to control the depth. A resulting structure is a sharp "V" shaped groove devices that provide low ruggedness and low reliability.

In addition to the depth control, the etch process preferably should leave the trench surfaces smooth and damage free to produce damage-free gate shallow trench regions. Such trench regions facilitate formation of a good quality gate oxide underlying the gate. A trench structure having a smooth, continuous curvature, without sharp corners, also facilitates formation of a good quality gate oxide and good gate electrode coverage in the trench.

Accordingly, a controlled etching technique is desirable, preferably an isotropic etching method, that would provide the shallow trench with smoothly curved walls. The present method incorporates use of oxidation and oxide strip steps to obtain a good etch control and smooth, substantially damage-free trench walls or surfaces.

FIGS. 7A–7C illustrate a method of fabricating a device having a shallow trench gate structure according to one embodiment of the present invention. The method provides an advantageous means of controlling the depth of the shallow trench and obtaining desirable trench profiles, i.e., smooth curvature without sharp edges and damage-free sidewalls. The conventional etch method alone generally does not provide a sufficiently accurate depth control for forming a shallow trench etch having a depth of about 0.5–1 μm with acceptable depth tolerance.

The present method uses a deep oxidation technique to obtain a shallow trench having desired profiles. FIG. 7A depicts a silicon substrate 400. A thin layer of silicon oxide layer 472 is provided on the substrate. The oxide is provided with a thickness of about 100 Å to 1000 Å. A silicon nitride layer 471 is provided on the oxide layer 472. The nitride is provided with a thickness of about 200 Å to 2000 Å. The layers are then masked and etched to expose portions 480 of the substrate (FIG. 7A). The nitride acts as a mask and prevents oxidation thereunder in subsequent oxidation steps of the substrate.

Referring to FIG. 7B, the exposed portion 480 of the substrate are oxidized to provide a thick oxide, i.e., a deep oxidation step is performed. A resulting oxide layer is provided with a thickness F1 about 8000 Å and more, preferably about 1 to 2 microns, at the exposed portions. The growth of silicon oxide causes consumption of the silicon in the exposed portions 480 of the substrate, thereby causing oxide 475 to extend into the substrate. Thickness of the oxide film relates to consumed thickness of silicon as 2.2:1, or about 2:1, so the depth of oxide penetration into the substrate is about one half of F1 (or ½ of F1).

Accordingly, the thickness of oxide is controlled according to the desired depth of the shallow trench. For example, if a shallow trench having a depth of 1 micron is desired, the oxide 475 is grown to a thickness of 2.2 micron. This method provides an accurate depth control since the oxide growth process generally can be controlled more accurately than conventional wet or dry etch methods. In one embodiment, the deep oxidation process is performed to form isolation structures, e.g., LOCOS, as well as the oxide 475.

After the oxide 475 has been grown to a given thickness, the nitride 471 is removed (FIG. 7C). Thereafter, the oxide is removed from the substrate. At this time the oxide layers 472 and 475 are removed together. As a result, the substrate is provided with a plurality of shallow trenches 485 having a depth F2 that is approximately one half (½) of F1 due to the consumption of the silicon surface during the oxidation process.

In one embodiment, the thickness of the oxide 475 is increased according to a desired depth of the trench 485. In another embodiment, the oxidation and oxide removal steps are repeated until a desired trench depth is obtained. That is, the oxide 475 is grown to a given thickness, e.g., 2 micron, and than removed and then another oxide is grown and then removed, and so on, thereby gradually consuming more of the silicon substrate and forming a deeper trench until a desired depth has been reached. The nitride layer 471 is removed once the repeated oxidation step has been completed.

One advantage of using the repeated oxidation method is that it enables the substrate to be processed faster since the growth of oxide slows significantly once it reaches a certain thickness. In one embodiment, the oxide 475 is grown to a thickness of no more than about 2 micron before removing it and re-growing the oxide. In another embodiment, the oxide is grown to a thickness of no more than about 1.5 micron before removing it and re-growing the oxide. In yet another embodiment, the oxide is provided with a thickness of no more than about 1 micron before removing it and re-growing the oxide.

After formation of a shallow trench having appropriate profiles, gate oxide is grown and a film of polysilicon is deposited onto the surface and patterned as needed to form the gate structures. Then the substrate is processed further to form the power devices thereon. The above method of shallow trench formation provides an accurate depth control and minimal surface damages since oxidation and its removal process tend to leave less damages to the trench sidewalls than convention dry etch methods.

Figure 8A:
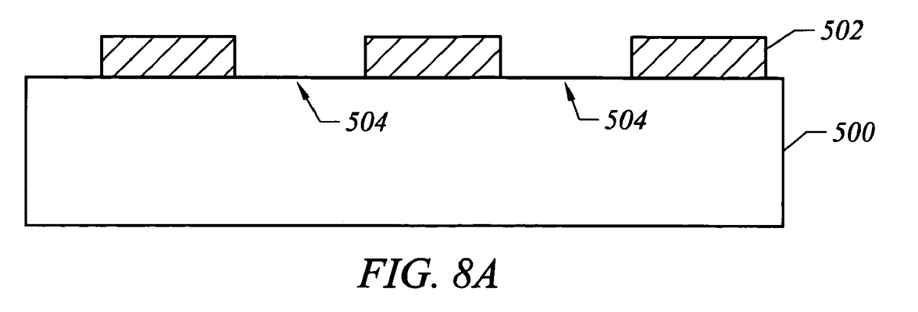
FIGS. 8A–8D illustrate a method for forming a shallow trench power MOSFET according to another embodiment of the present invention.
Figure 8B:
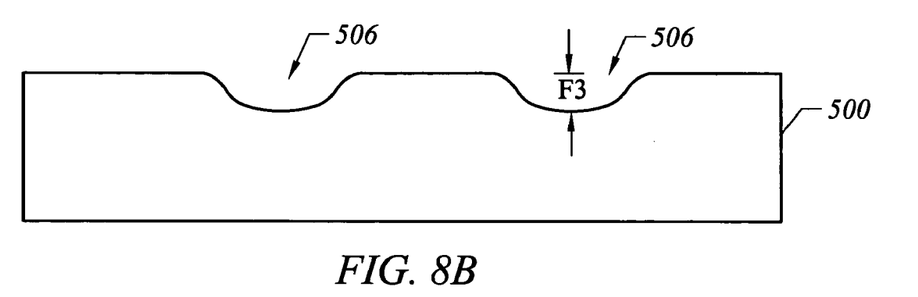

FIGS. 8A–8D illustrates a method of forming a shallow trench according to another embodiment of the present invention. A masking layer 502 is formed on a silicon substrate 500. The masking layer may be photoresist, silicon nitride, silicon oxide, or the like. The layer 502 is patterned to expose portions 504 of the substrate whereon shallow trenches will be formed. The substrate is etched to a depth F3 that is slightly less than the desired depth of the shallow trench to form partially formed trenches 506 (FIG. 8B). In one embodiment, the depth F3 of the trench 506 is no more than 2 micron, or no more than 1.5 micron, or no more than 1 micron, or 0.5 micron or less. The masking layer 502 is then removed from the substrate.

Figure 8C:
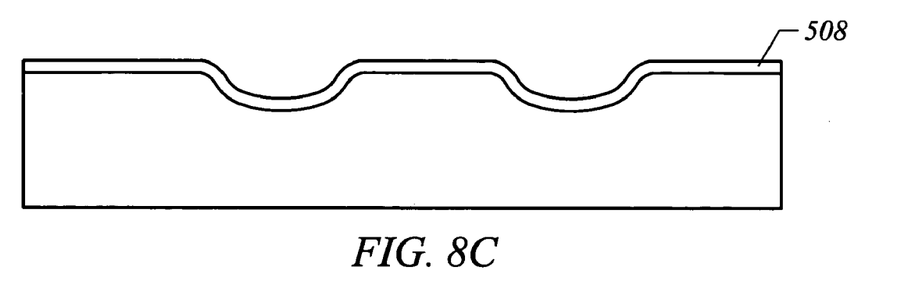
Figure 8D:
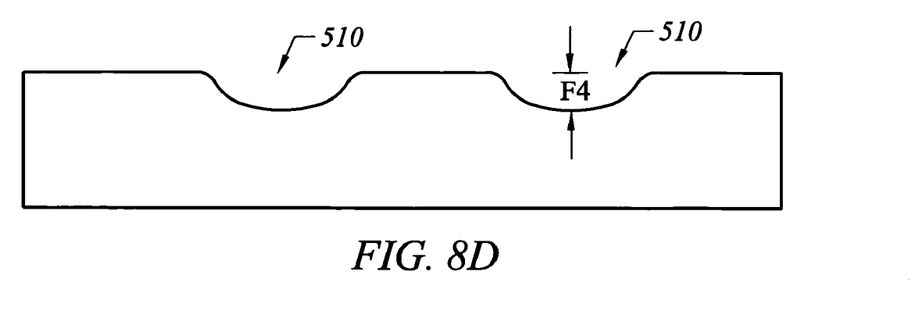

An oxide layer 508 is grown over the substrate and the trenches 506. The oxide is grown to a thickness of about 0.5 micron to about 1.5 micron. That is, a deep oxidation process is performed. Corners and edges of the trench are smoothed out as a result of thick oxidation. The oxide 508 is removed from the substrate to form shallow trenches 510 that have a depth F4. The depth F4 is slightly deeper than the depth F3 due to silicon consumption during the above oxidation process. For example, if the oxide 508 is grown to thickness of 1 micron, the depth F4 would be about 0.5 micron deeper than the depth F3.

The above oxidation step also removes damaged silicon surfaces resulting from the etch step and provides smoother surfaces as well. The substrate is further processed using standard techniques to fabricate power device thereon.

In one embodiment, a power device having a shallow trench gate structure is provided with a p-well depth P1 of 1 micron or less. Accordingly, the shallow trench has a depth of no more than 1 micron or less.

FIGS. 9A–9D illustrates a method of forming a shallow trench power device according to another embodiment of the present invention, wherein a shallow trench gate is formed together with a local isolation structure. A silicon oxide 702 is formed to a thickness of about 400–800 Å on a silicon substrate 700 (FIG. 8A). A silicon nitride layer 704 is formed over the silicon oxide layer to a thickness of 0.1–0.2 μm. A photoresist layer 706 is deposited over the silicon nitride layer and is patterned to expose portions of the silicon nitride layer. The exposed silicon nitride and silicon oxide are etched. Portions of the silicon substrate 700 underlying the exposed silicon nitride are removed to form trenches 708 and 710. The trenches 708 and 710 are further processed to form a shallow trench gate and a LOCOS, as explained below. Accordingly, the trench 708 may be referred to as an intermediate trench, and the trench 710 may be referred to as an isolation trench. In one embodiment, the trenches 708 and 710 are provided with a depth that is one half of the desired the shallow trench depth (e.g., the depth D1 of the trench 312 in FIG. 6).

Figure 9A:
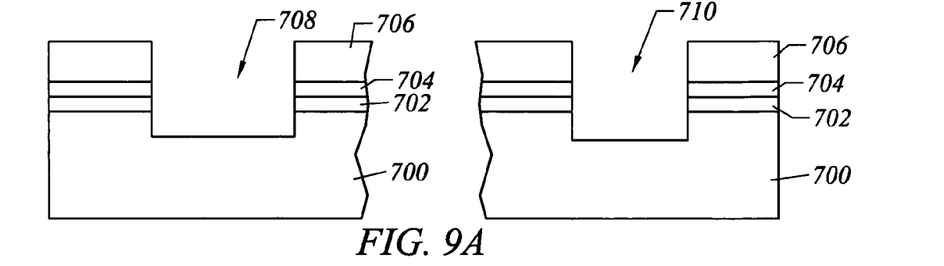
FIGS. 9A–9D illustrate a method for forming a shallow trench power MOSFET according to yet another embodiment of the present invention.
Figure 9B:
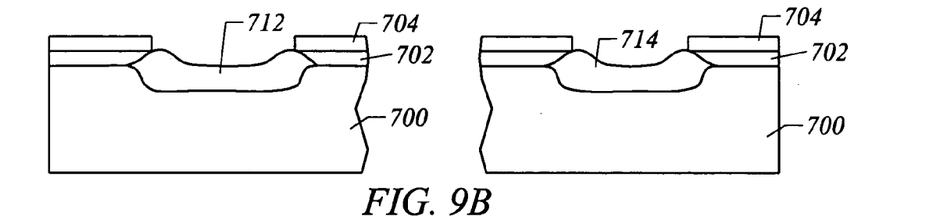
Figure 9C:
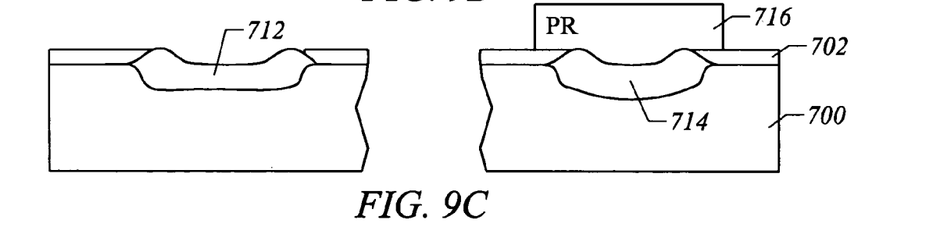
Figure 9D:
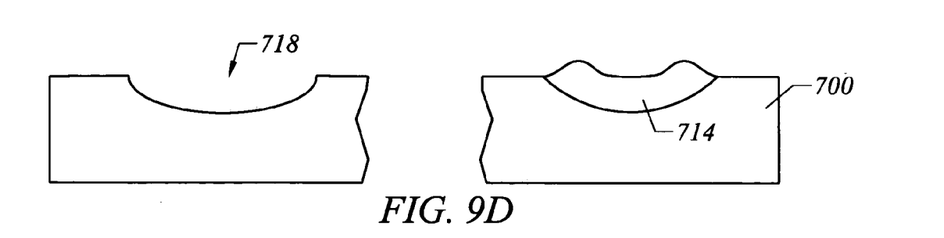

The photoresist 706 is removed (FIG. 9B). Thick oxides 712 and 714 are formed within the trenches 708 and 710 to a thickness that is about the same as the desired shallow trench depth. The silicon nitride layer 704 is stripped away (FIG. 9B). A photoresist layer 716 is deposited over the silicon oxide layer 702 and the thick oxides 712 and 714. The photoresist layer 716 is patterned to cover the thick oxide 714. The exposed oxides are etched away while preserving the thick oxide 714, so that it may be used as an isolation structure (FIG. 9D). A resulting trench 718 has a depth that is about twice that of the trench 708. Thereafter, a shallow trench gate is formed within the trench 718.

Figure 10:
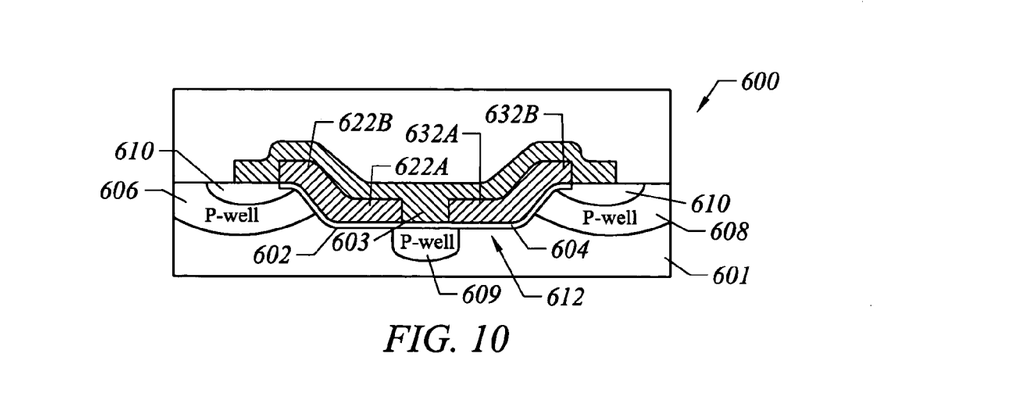
FIG. 10 illustrates a cross-section view of a shallow trench power MOSFET with a split gate configuration according to one embodiment of the present invention.

FIG. 10 illustrates a cross-sectional view of a shallow trench power MOSFET 600 having a split gate structure according to one embodiment of the present invention. The device has a gate structure 602 that extends into a shallow trench 612 that has been etched into a substrate 601. The gate structure 602 includes a first gate portion 622 and a second gate portion 632 that are spaced apart from each other. The first gate portion has an upper portion 622B that is provided over the substrate and outside of the trench 612 and a lower portion 622A that is provided in the trench 612. The second gate portion has an upper portion 632B that is provided over the substrate and outside of the trench 612 and a lower portion 632A that is provided in the trench 612.

In one embodiment, the gate structure 602 is provided with the substantially the same configuration as the device 300 of FIG. 6. One difference is that the split gate device 600 is formed by etching a middle portion 603 of the gate, thereby separating it into two sections (i.e., the first and second gate portions), whereas the device 300 has a single continuous gate structure. Also, the split gate device 600 may be provided with a trench that has a greater width than that of the single gate device 300 in certain applications. Yet another difference is that the split gate device 600 is provided with a P-well region 609 below the middle portion 603 that has been etched away.

As shown in FIG. 10, however, the split gate device 600 resembles the single gate device 300 in many ways. For example, the device 600 includes a gate oxide 604 provided between the gate structure 602 and substrate 601. A first p-well 606 and a second p-well 608 are provided at opposing edges of the gate structure 602. A plurality of source regions 610 are defined within the p-wells 606 and 608. A drain region (not shown) is defined on an opposing side of the substrate. The split gate device 600 provides even higher breakdown voltage than the single gate device 300. If the single gate device 300 is configured to be a split gate device, the present inventor has observed that the breakdown voltage increased from 330 volts to 365 volts.

Figures 11A, 11B, 11C, 12:
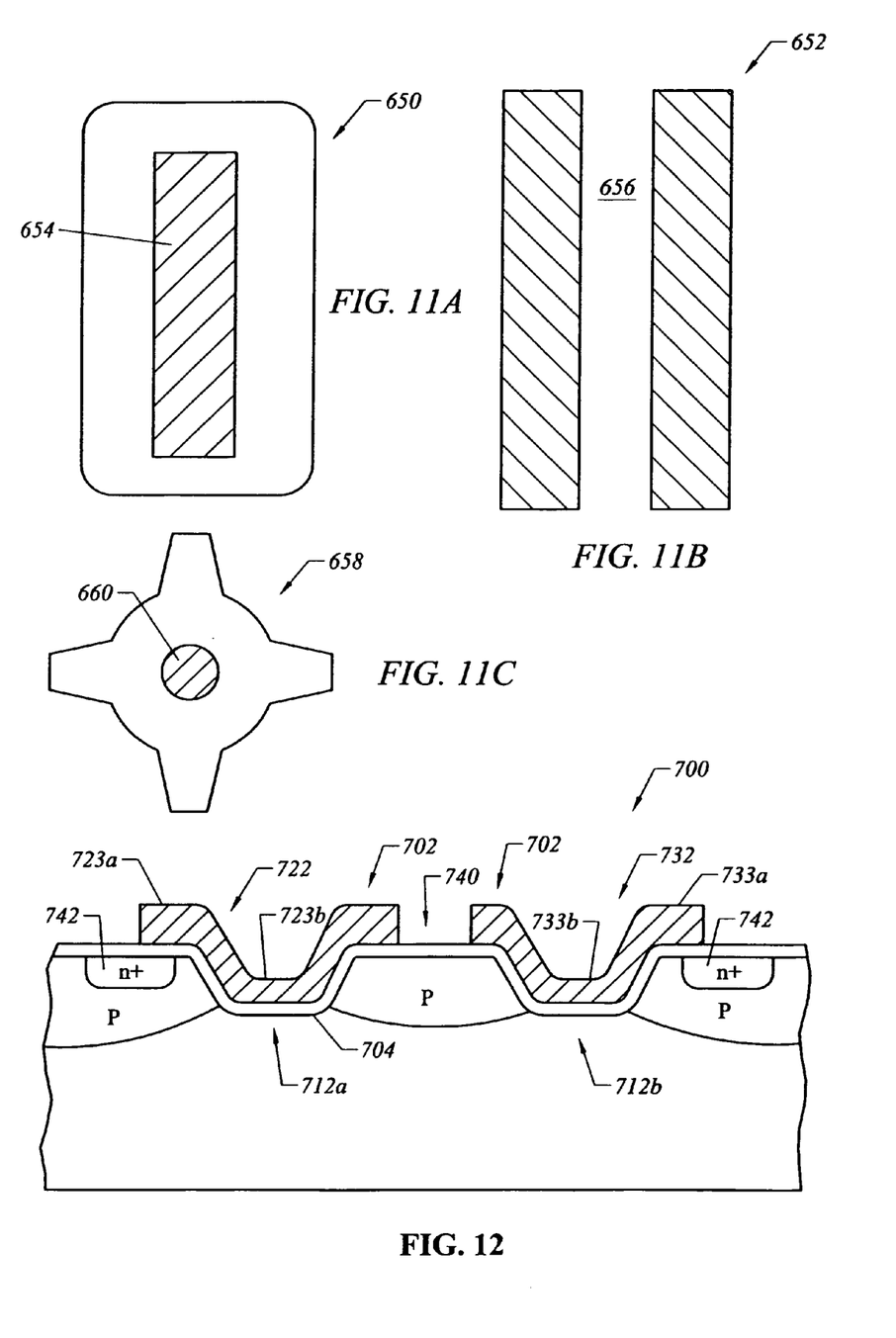
FIGS. 11A and 11B show top plan views of split gate structures that are provided with strip structures according to one embodiment of the present invention.
FIG. 11C shows a top plan view of a split gate structure that is provided with a cell structure according to another embodiment of the present invention.
FIG. 12 illustrates a cross sectional view of a shallow view of a shallow trench power MOSFET having a split gate structure according to another embodiment of the present invention.

The device 600 shown in FIG. 10 is merely a cross-sectional view of the device. The device 600 according could have either a strip structure or a cell structure. FIGS. 11A and 11B show top plan views of split gate structures 650 and 652 that are provided with strip structures; these gate structures have elongated openings 654 and 656, respectively. FIG. 11C shows a top plan view of a split gate structure 658 that is provided with a cell structure. The gate structure includes a circular or non-elongated opening 660.

FIG. 12 illustrates a cross-sectional view of a shallow trench power MOSFET 700 having a split gate structure according to another embodiment of the present invention. The device has a gate structure 702 that extends into first and second shallow trenches 712a and 712b that have been etched into a substrate 701. A gate oxide 704 is provided below the gate structure 702.

The gate structure 702 includes a first gate portion 722 and a second gate portion 732 that are spaced apart from each other. The first and second portions 722 and 732 extend into the first and second shallow trenches 712a and 712b, respectively. The first gate portion has an upper portion 723a that is provided over the substrate and outside of the trench 712a and a lower portion 723b that is provided in the trench 712a. The second gate portion has an upper portion 733a that is provided over the substrate and outside of the trench 712b and a lower portion 733b that is provided in the trench 712b. An opening or space 740 is provided between the first and second gate portions 722 and 732.

As with the device 600, the device 700 merely shows a cross-sectional view of a given portion of the device 700. Accordingly, the first and second gate portions 722 and 732 may be joined to each other at another location of the device (see FIGS. 11A and 11C). The upper portions 723a and 733a that are proximate the opening 740 are configured to float electrically. The upper portions that are remote from the opening 740 are coupled to source regions 742.

In one embodiment, the device 700 has the entire gate structure 702 are substantially formed within the trenches 712a and 712b. In another embodiment, the device 700 has the gate structure 702 that has the upper portion 723a or 733a that extends outside of the trench only at one side of the trench.

As used herein, the term "shallow trench gate structure" refers to a gate that extends downward into a trench or groove of a substrate, wherein a bottom portion of the gate does not extend beyond a lowest point of a doped base region of the substrate, the doped region being configured for forming one or more source regions therein.

As used herein, the term "power device" refers to a semiconductor device that is configured to handle 50 volts or more.

As used herein, the term "deep oxidation process" refers to forming an oxide layer having thickness of at least 0.3 micron on a substrate.

The teachings of the present embodiments may be applied to any MOS gated power semiconductor device that contains one or more diffused bases or wells that produce a curvature at its upper surface. These devices include MOSFETs and IGBT and several types of thyristors.

While the invention has been particularly illustrated and described with reference to specific embodiments thereof, it will be understood by those skilled in the art that the foregoing and other changes in the form and details may be made therein without departing from the spirit or scope of the invention. Therefore, the scope of this invention should not be limited to the embodiments described above, and should instead be defined by the following claims.

What is claimed is:

1. A method for fabricating a power semiconductor device, comprising:

forming a shallow trench on a substrate having a first surface and a second surface, the shallow trench having a first depth and a width, the width of the shallow trench being greater than the first depth of the shallow trench;

forming a doped region provided proximate the first surface of the substrate and having a second depth;

forming a source region provided within the doped region and proximate the first surface; and forming a gate structure provided adjacent the source region, the gate structure including a first portion provided within the shallow trench and a second portion provide outside of the trench, wherein the first portion includes a lateral extension and that is parallel to the first and second surface of the substrate, wherein the lateral extension of the first portion is at least 2.5 times greater than the first depth of the shallow trench, wherein forming the shallow trench includes:
  etching the substrate to form an intermediate trench having a third depth that is less than the first depth;
  forming a first oxide layer within the intermediate layer; and
  removing the oxide layer formed within the intermediate trench, wherein a resulting trench from the removal of the oxide layer has a fourth depth that is greater than the third depth.

2. The method of claim 1, wherein an isolation trench is formed in another location on the substrate during the etching step, wherein a second oxide layer is formed within the isolation structure at the same time the first oxide layer is formed within the intermediate trench, the first oxide layer being further processed to be an isolation structure.

3. A method for fabricating a power semiconductor device, comprising:
  forming a shallow trench on a substrate having a first surface and a second surface, the shallow trench having a first depth and a width, the width of the shallow trench being greater than the first depth of the shallow trench;
  forming a doped region provided proximate the first surface of the substrate and having a second depth;
  forming a source region provided within the first doped region and proximate the first surface; and
  forming a gate structure provided adjacent the source region, the gate structure including a first portion provided within the shallow trench and a second portion provide outside of the trench, wherein forming the shallow trench includes:
  etching the substrate to form an intermediate trench having a third depth that is less than the first depth;
  forming a first oxide layer within the intermediate layer; and
  removing the oxide layer formed within the intermediate trench, wherein a resulting trench from the removal of the oxide layer has a fourth depth that is greater than the third depth.

4. The method of claim 3, wherein an isolation trench is formed in another location on the substrate during the etching step, wherein a second oxide layer is formed within the isolation structure at the same time the first oxide layer is formed within the intermediate trench, the first oxide layer being further processed to be an isolation structure.

5. A power semiconductor device, comprising:
  a substrate having an upper surface and a lower surface, the substrate having a trench;
  first and second doped regions provided proximate the upper surface of the substrate;
  a first source region provided within the first doped region;
  a second source region provided within the second doped region; and
  a gate provided between the first and second source regions, the gate including a first portion extending laterally within the trench, wherein a depth of the trench is no more than a depth of the first doped region, wherein the gate has a lateral extension and a vertical extension, the lateral extension being substantially greater than the vertical extension to reduce the curvature of equi-potential lines that are defined below the gate and the first and second dope regions, wherein the gate is formed by etching the substrate to form an intermediate trench having a third depth that is less than the depth of the trench, forming a first oxide layer within the intermediate layer, and removing the oxide layer formed within the intermediate trench, wherein a resulting trench from the removal of the oxide layer has a fourth depth that is greater than the third depth.

* * * * *